(12) United States Patent
Tsukahara

(10) Patent No.: US 9,741,674 B2
(45) Date of Patent: Aug. 22, 2017

(54) SEMICONDUCTOR DEVICE

(71) Applicant: Mitsubishi Electric Corporation, Tokyo (JP)

(72) Inventor: Yoshihiro Tsukahara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/143,018

(22) Filed: Apr. 29, 2016

(65) Prior Publication Data

US 2017/0069583 A1    Mar. 9, 2017

(30) Foreign Application Priority Data

Sep. 9, 2015    (JP) ................. 2015-177311

(51) Int. Cl.
| | |
|---|---|
| *H01L 27/14* | (2006.01) |
| *H01L 31/00* | (2006.01) |
| *H01L 23/66* | (2006.01) |
| *H01L 23/00* | (2006.01) |
| *H01L 23/528* | (2006.01) |
| *H01L 25/07* | (2006.01) |
| *H01L 23/31* | (2006.01) |

(52) U.S. Cl.
CPC ......... *H01L 23/66* (2013.01); *H01L 23/3114* (2013.01); *H01L 23/528* (2013.01); *H01L 24/06* (2013.01); *H01L 25/071* (2013.01); *H01L 2224/0401* (2013.01); *H01L 2924/1304* (2013.01); *H01L 2924/20271* (2013.01)

(58) Field of Classification Search
CPC ......... H01L 23/66; H01L 24/05; H01L 24/06; H01L 25/0753
USPC ....................................... 257/428
See application file for complete search history.

(56) References Cited

U.S. PATENT DOCUMENTS

| | | | | |
|---|---|---|---|---|
| 9,319,006 B2 * | 4/2016 | Solomko | ................ | H03F 1/56 |
| 2009/0170242 A1 * | 7/2009 | Lin | ..................... | H01L 21/6835 438/107 |

FOREIGN PATENT DOCUMENTS

| | | |
|---|---|---|
| JP | 2008-066657 A | 3/2008 |
| JP | 2008-182264 A | 8/2008 |
| JP | 2010-182741 A | 8/2010 |

* cited by examiner

*Primary Examiner* — Theresa T Doan
(74) *Attorney, Agent, or Firm* — Studebaker & Brackett PC

(57) ABSTRACT

A semiconductor device includes a semiconductor substrate in which a through hole is formed, a transistor formed on the upper surface side of the semiconductor substrate, a detection circuit formed on the upper surface side of the semiconductor substrate and connected to the transistor, a dielectric film covering the transistor and the detection circuit, a solder bump formed on the dielectric film, and a pad electrode having a first portion connected to an output of the detection circuit in the through hole, and a second portion connected to the first portion and provided on a lower surface of the semiconductor substrate.

5 Claims, 7 Drawing Sheets

SEMICONDUCTOR DEVICE

BACKGROUND OF THE INVENTION

Field of the Invention

The present invention relates to a semiconductor device for use, for example, in a radiofrequency-band wireless apparatus or a radiofrequency-band radar or milliwave-band radar apparatus.

Background Art

There is a demand for reducing in size, improving in performance and reducing in cost in a radiofrequency-band device operating in a radiofrequency band. As a radiofrequency-band device, a monolithic microwave IC (MMIC) having an active element such as a transistor and a matching circuit integrally formed on a semi-insulating substrate is being widely used. The matching circuit is constituted by a passive circuit having, for example, a resistor, a metal-insulator-metal (MIM) capacitor formed of an upper-layer metal, a lower-layer metal and a dielectric film interposed between the upper-layer metal and the lower-layer metal, and a spiral inductor having a wiring metal in looped form.

A chip-scale package (CSP) is ordinarily used as a package for an MMIC. The chip-scale package is a package having solder balls formed on a semiconductor device (MMIC) so that the MMIC can be directly reflow-mounted on a printed circuit board or the like. Japanese Patent Laid-Open No. 2008-066657 discloses a CSP.

Japanese Patent Laid-Open No. 2010-182741 discloses a CSP in which a semiconductor chip is encapsulated in a package of a size substantially equal to the size of the semiconductor chip. Japanese Patent Laid-Open No. 2010-182741 also discloses an arrangement in which a back surface electrode is provided on an upper surface of a semiconductor chip while solder bumps are provided on a lower surface of the semiconductor chip.

A plurality of solder bumps are formed on a front surface of a semiconductor device constituted by a CSP-type MMIC. The plurality of solder bumps are fixed on a substrate to face-down-mount the semiconductor device on the substrate. When the semiconductor device is mounted on the substrate, a back surface portion opposite from the front surface of the semiconductor device is exposed. There is, therefore, a problem that inspection of characteristics of the semiconductor device mounted on the substrate cannot be performed.

SUMMARY OF THE INVENTION

In view of the above-described problem, an object of the present invention is to provide a semiconductor device whose characteristics can be easily inspected when the semiconductor device is in a state of being mounted on a substrate.

The features and advantages of the present invention may be summarized as follows.

According to one aspect of the present invention, a semiconductor device includes a semiconductor substrate in which a through hole is formed, a transistor formed on the upper surface side of the semiconductor substrate, a detection circuit formed on the upper surface side of the semiconductor substrate and connected to the transistor, a dielectric film covering the transistor and the detection circuit, a solder bump formed on the dielectric film, and a pad electrode having a first portion connected to an output of the detection circuit in the through hole, and a second portion connected to the first portion and provided on a lower surface of the semiconductor substrate.

According to another aspect of the present invention, a semiconductor device includes a semiconductor substrate in which a through hole is formed, a transistor formed on the upper surface side of the semiconductor substrate, a coupler circuit formed on the upper surface side of the semiconductor substrate and connected to the transistor, a dielectric film covering the transistor and the coupler circuit, a solder bump formed on the dielectric film, and a pad electrode having a first portion connected to an output of the coupler circuit in the through hole, and a second portion connected to the first portion and provided on a lower surface of the semiconductor substrate.

Other and further objects, features and advantages of the invention will appear more fully from the following description.

DETAILED DESCRIPTION OF THE PREFERRED EMBODIMENTS

Figure 1:
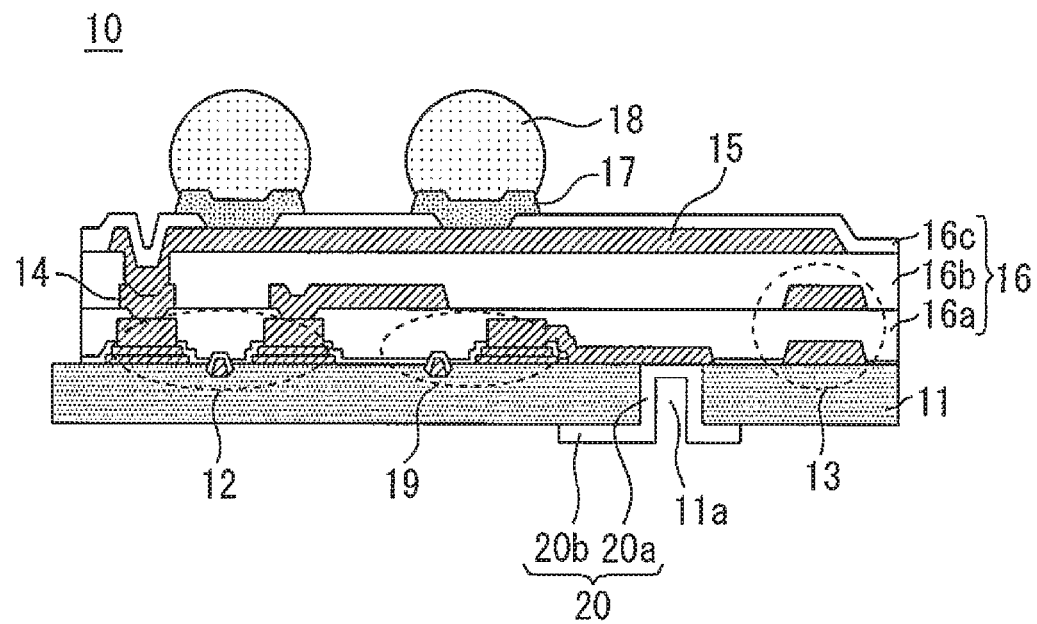
FIG. 1 is sectional view of a semiconductor device according to a first embodiment.

Semiconductor devices according to embodiments of the present invention will be described with reference to the accompanying drawings. Components identical or corresponding to each other are assigned the same reference characters and repeated description of them is avoided in some cases.

First Embodiment

FIG. 1 is a sectional view of a semiconductor device 10 according to a first embodiment. The semiconductor device 10 is a chip-scale package type of MMIC. The semiconductor device 10 has a semiconductor substrate 11 formed, for example, of GaAs. A through hole 11a is formed in the semiconductor substrate 11. A transistor 12, a capacitor 13 and a diode 19 are formed on the upper surface side of the semiconductor substrate 11. The transistor 12, the capacitor 13 and the diode 19 are formed in portions indicated by being surrounded with broken lines. Elements other than the transistor 12, the capacitor 13 and the diode 19 are also formed on the upper surface side of the semiconductor substrate 11. In the first embodiment, passive circuits forming matching circuits and a detection circuit having the diode 19 are formed on the upper surface side of the semiconductor substrate 11. Active elements and passive circuits other than those described above may also be formed on the semiconductor substrate 11. A transistor formed as an active element may be used in place of the diode 19 in the detection circuit.

An intermediate wiring layer 14 and an upper-layer wiring layer 15 are formed on the upper surface side of the semiconductor substrate 11. These layers are part of a multilayer wiring structure. The number of wiring layers included in the multilayer wiring structure is not particularly limited. The multilayer wiring structure electrically connects the elements formed on the upper surface side of the semiconductor substrate 11 to each other. All the elements (including the transistor 12, the capacitor 13, the matching circuits, and the detection circuit 22 having the diode 19) and all the wiring layers (including the intermediate wiring layer 14 and the upper-layer wiring layer 15) formed on the upper surface side of the semiconductor substrate 11 are covered with a dielectric film 16 (dielectric films 16a, 16b, and 16c), the dielectric film 16 being formed on each wiring layer. The material of the dielectric film 16 is, for example, polyimide or some other dielectric. The above-described capacitor 13 is a MIM capacitor having an upper-layer metal, a lower-layer metal and the dielectric film 16 interposed between these metals.

The dielectric film 16c on the upper-layer wiring layer 15 has openings in its upper surface. The upper-layer wiring layer 15 is exposed through the openings. An under bump metal 17 is provided on the upper-layer wiring layer 15 exposed through the openings. A solder bump 18 (solder ball) is provided on the under bump metal 17. As is apparent from FIG. 1, a plurality of solder bumps 18 are formed on the dielectric film 16.

The semiconductor device 10 has a pad electrode 20, which has a first portion 20a connected to the detection circuit (diode 19) in the through hole 11a and a second portion 20b connected to the first portion 20a and provided on a lower surface of the semiconductor substrate 11.

Figure 2:
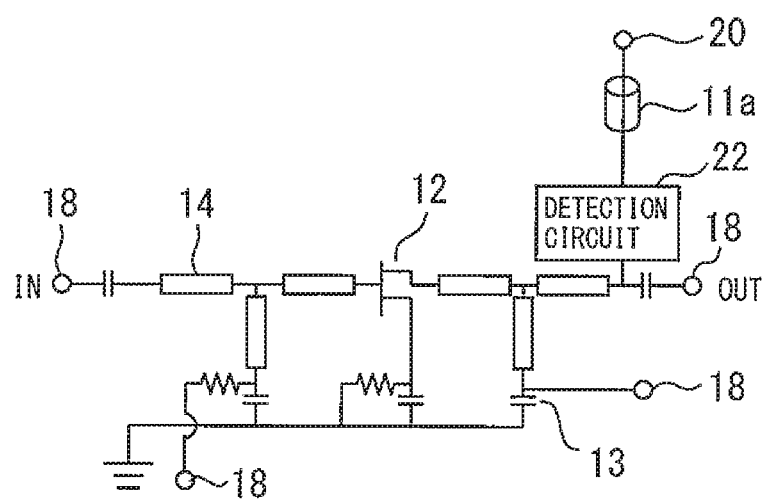
FIG. 2 is a circuit diagram of the semiconductor device according to the first embodiment.

FIG. 2 is a circuit diagram of the semiconductor device 10 according to the first embodiment. Each matching circuit has an inductor formed by a transmission line using a wiring metal and the capacitor 13. The matching circuits are connected on the input side and the output side of the transistor 12. The matching circuits may alternatively be of a different configuration. The detection circuit 22 having the above-described diode 19 is connected to one of the matching circuits. The detection circuit 22 employs a well-known circuit configuration having passive elements, e.g., a diode and a capacitor. The detection circuit 22 may alternatively be formed only of a diode. The detection circuit 22 detects the level of a radiofrequency-band output signal from the transistor 12 and applies an output voltage according to this signal level to the pad electrode 20.

Figure 3:
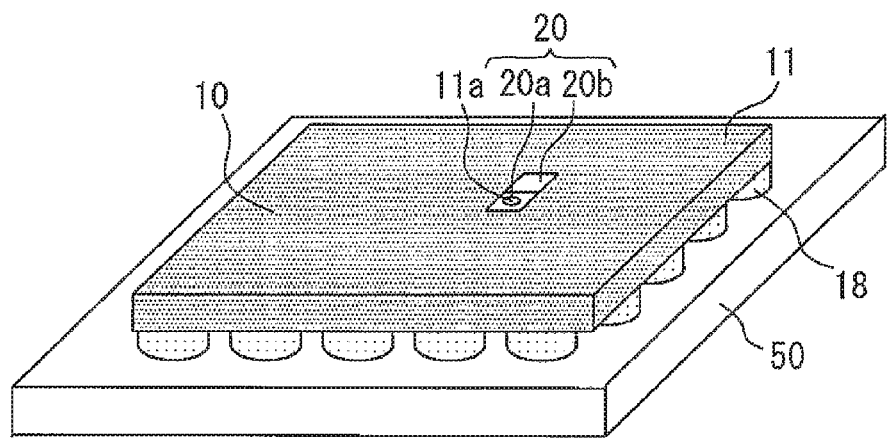
FIG. 3 is a perspective view of the semiconductor device mounted on a substrate.

FIG. 3 is a perspective view of the semiconductor device mounted on a substrate. Circuit patterns and pads are formed on the substrate 50, and various devices are mounted on the pads. FIG. 3, however, illustrates only the substrate 50. The solder bumps 18 of the semiconductor device 10 are connected to the substrate 50 at predetermined positions. The semiconductor device 10 is thereby face-down-mounted on the substrate 50. As a result of face-down mounting, the pad electrode 20 on the back surface of the semiconductor substrate 11 (the surface on which the solder bumps 18 are not formed) is exposed on the front surface.

Figure 4:
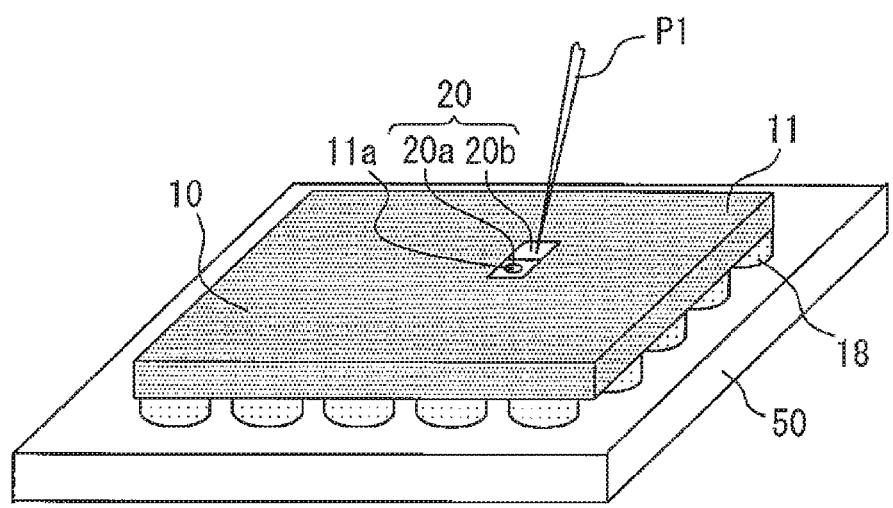
FIG. 4 is a diagram showing a method of inspecting characteristics of the semiconductor device.

The semiconductor device 10 according to the first embodiment of the present invention is capable of having its characteristics inspected while being mounted on the substrate 50. FIG. 4 is a diagram showing a method of inspecting characteristics of the semiconductor device 10. At the time of inspection, a probe jig having a plurality of probes including an inspection probe P1 is used. The probe jig is brought close to the substrate 50, the inspection probe P1 is brought into contact with the pad electrode 20, and other probes are also brought into contact with predetermined pads on the substrate 50.

An input signal is then supplied to an input terminal of the semiconductor device 10 (the solder bump 18 at the left end as viewed in FIG. 2), and an output from the detection circuit 22 is detected with the inspection probe P1. A characteristic of the semiconductor device 10 in the state of being mounted on the substrate 50 is inspected thereby. The connection of the output terminal of the detection circuit 22 to the pad electrode 20 provided on the back surface of the semiconductor substrate 11 enables this inspection. A signal detected by the detection circuit 22 is a radiofrequency signal or a milliwave-band signal from the transistor 12.

In the case where a pad connected to the output of the detection circuit is provided on the substrate 50 and the probe is set to the pad, the size of the substrate 50 is necessarily increased by an amount for the provision of the pad. In the first embodiment of the present invention, however, there is no need to increase the size of the substrate 50 since the output from the detection circuit 22 is detected through the pad electrode 20 provided on the back surface of the semiconductor device 10.

In the first embodiment of the present invention, a characteristic of the semiconductor device 10 is detected with the detection circuit 22 connected to the output of the transistor 12 through the matching circuit. The detection circuit 22, however, can be widely used for inspection of characteristics of the active elements including the transistor 12 formed on the semiconductor substrate 11 and the passive circuits forming the matching circuits. The detection circuit can therefore be connected to any points for desired inspections.

In a chip-scale package type of MMIC, solder bumps are disposed with a predetermined pitch. The package of the semiconductor device, however, is not limited to the chip-scale package. The package of the semiconductor device may be a package such as a flip chip with no limitation of the positions of solder bumps.

These modifications can also be applied to semiconductor devices according to embodiments described below. Each of the semiconductor devices according to the embodiments described below has a number of commonalities with the first embodiment and will therefore be described mainly with respect to points of difference from the first embodiment.

Second Embodiment

Figure 5:
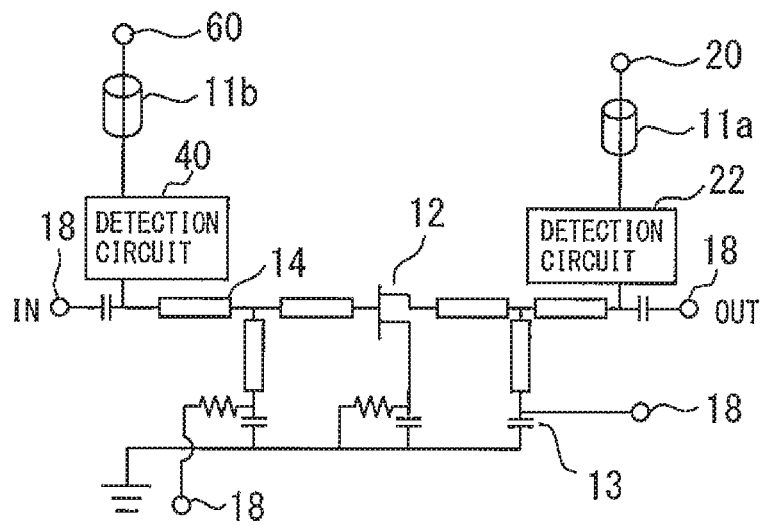
FIG. 5 is a circuit diagram of the semiconductor device according to the second embodiment.

FIG. 5 is a circuit diagram of the semiconductor device according to the second embodiment. An input-side detection circuit 40 is connected on the input side of the transistor 12. More specifically, the input-side detection circuit 40 is connected to the input of the transistor 12 through the matching circuit. The input-side detection circuit 40 is formed in the dielectric film 16 (see FIG. 1) together with the detection circuit 22. The input-side detection circuit 40 has passive elements, e.g., a diode and a capacitor. An output of the input-side detection circuit 40 is connected to an input detection pad electrode 60 formed in a through hole 11b formed in the semiconductor substrate 11 and on the back surface of the semiconductor substrate 11.

Figure 6:
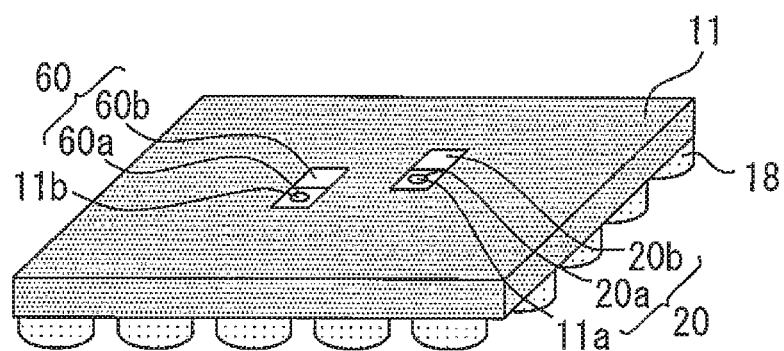
FIG. 6 is a perspective view of the semiconductor device.

FIG. 6 is a perspective view of the semiconductor device. The through hole 11b is formed in the semiconductor substrate 11. The through hole 11b is a through hole other than the through hole 11a. The input detection pad electrode 60 has a third portion 60a connected to the output of the input-side detection circuit 40 in the through hole 11b and a fourth portion 60b connected to the third portion 60a and provided on the lower surface of the semiconductor substrate 11. In the semiconductor device according to the second embodiment of the present invention, the output from the detection circuit 22 connected on the output side of the transistor 12 is led to the back surface side (lower surface side) of the semiconductor substrate 11 through the pad electrode 20, and the output from the input-side detection circuit 40 connected to the input of the transistor 12 is led to the back surface side of the semiconductor substrate 11 through the input detection pad electrode 60.

Figure 7:
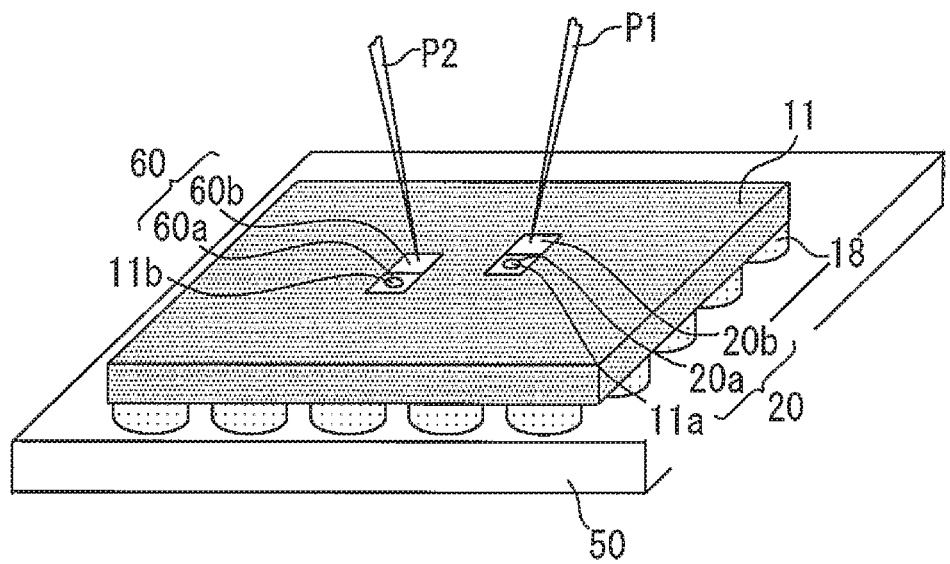
FIG. 7 is a diagram showing a method of inspecting the semiconductor device.

FIG. 7 is a diagram showing a method of inspecting the semiconductor device face-down-mounted. The pad electrode 20 and the input detection pad electrode 60 provided on the back surface of the semiconductor device are exposed to the outside. In this state, while the inspection probe P1 is brought into contact with the pad electrode 20, an inspection probe P2 is brought into contact with the input detection pad electrode 60 and an input signal is applied to the transistor 12, thereby inspecting a characteristic of the semiconductor device.

The semiconductor device according to the second embodiment is capable of facilitating inspection of output characteristics of the transistor 12 in the state where the semiconductor device is mounted on the substrate and also facilitating inspection of characteristics of a radiofrequency-band and milliwave-band input signal input to the transistor 12.

Third Embodiment

Figure 8:
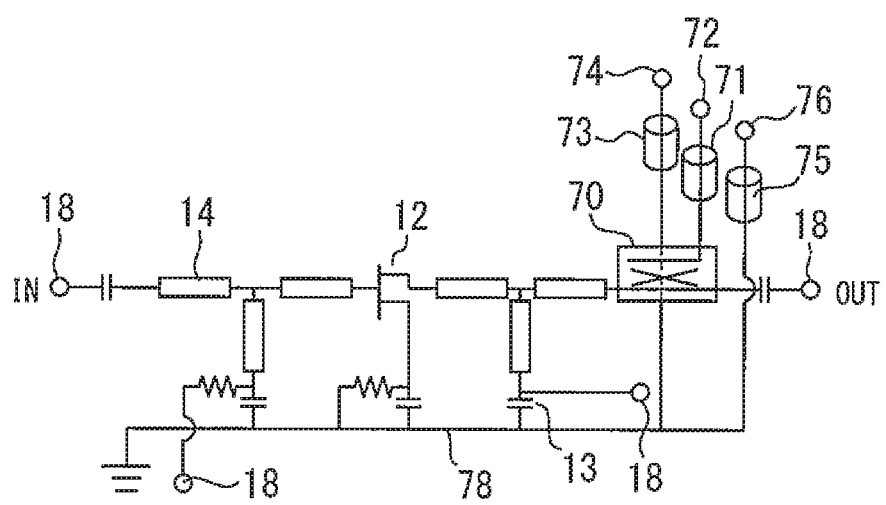
FIG. 8 is a circuit diagram of the semiconductor device according to the third embodiment.

FIG. 8 is a circuit diagram of the semiconductor device according to the third embodiment. The semiconductor device according to the third embodiment has a coupler circuit 70 connected on the output side of the transistor 12, with the matching circuit interposed between the coupler circuit 70 and the transistor 12. The coupler circuit 70 is formed on the upper surface side of the semiconductor substrate and is covered with the dielectric film 16 (see FIG. 1), as are the transistor 12 and other elements. The coupler circuit 70 is a circuit for divergence of the level of a radiofrequency-band signal (RF signal) from the transistor 12. One output from the coupler circuit 70 is transmitted to the solder bump 18 at the right end as an output from the semiconductor device. Another output from the coupler circuit 70 is used for inspection. The semiconductor device has a grounding line 78, which is formed in the dielectric film 16.

Figure 9:
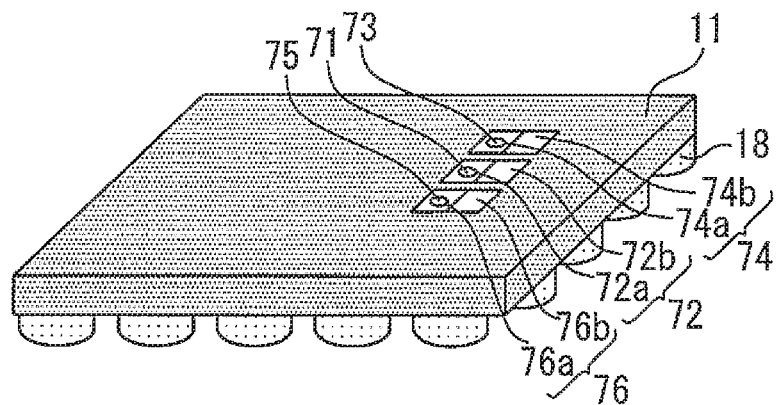
FIG. 9 is a perspective view of the semiconductor device according to the third embodiment.

A through hole 71 and additional through holes 73 and 75 are formed in the semiconductor substrate. A pad electrode 72 and grounding electrodes 74 and 76 are also provided on the semiconductor device. FIG. 9 is a perspective view of the semiconductor device according to the third embodiment. The through hole 71 is formed in the semiconductor substrate 11. The pad electrode 72 has a first portion 72a provided in the through hole 71 and connected to an output of the coupler circuit 70 and a second portion 72b connected to the first portion 72a and provided on the lower surface of the semiconductor substrate 11.

The additional through hole 73 is provided in the semiconductor substrate 11. The grounding electrode 74 has an in-hole portion 74a connected to the grounding line 78 in the additional through hole 73 and an out-of-hole portion 74b connected to the in-hole portion 74a and provided on the lower surface of the semiconductor substrate 11.

The additional through hole 75 is provided in the semiconductor substrate 11. The grounding electrode 76 has an in-hole portion 76a connected to the grounding line 78 in the additional through hole 75 and an out-of-hole portion 76b connected to the in-hole portion 76a and provided on the lower surface of the semiconductor substrate 11.

Figure 10:
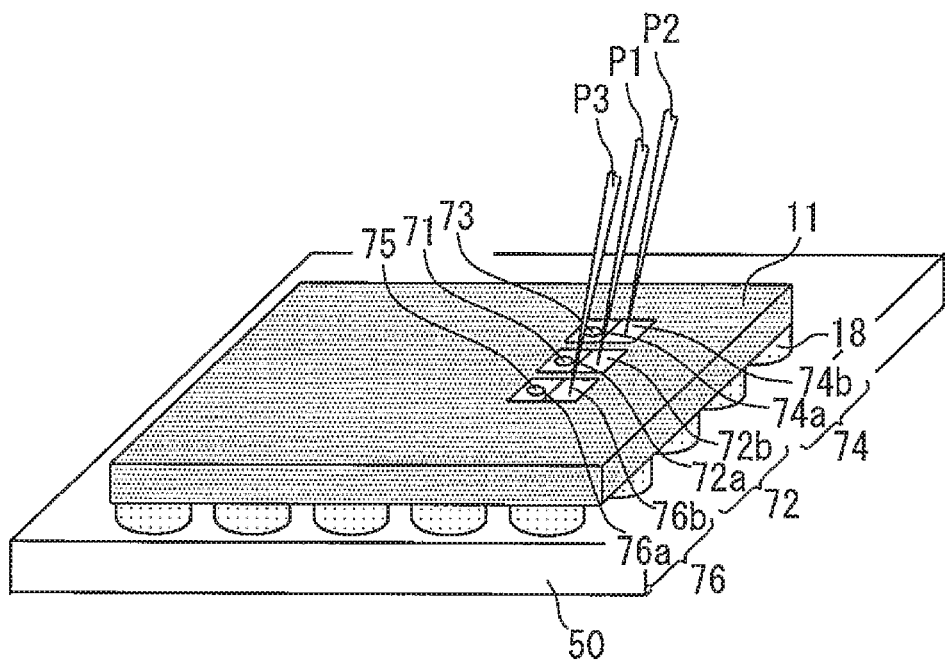
FIG. 10 is a diagram showing a method of inspecting the semiconductor device.

FIG. 10 is a diagram showing a method of inspecting the semiconductor device face-down-mounted. The pad electrode 72 and the grounding electrodes 74 and 76 provided on the back surface of the mounted semiconductor device are exposed to the outside. In this state, while the inspection probe P1 is brought into contact with the pad electrode 72, inspection probes P2 and P3 are brought into contact with the grounding electrodes 74 and 76, respectively, and an input signal is applied to the transistor 12, thereby inspecting a characteristic of the semiconductor device.

Thus, the provision of the pad electrode 72 and the grounding electrodes 74 and 76 opposite from the surface on which the semiconductor device is mounted enables inspection of characteristics of the semiconductor device while the semiconductor device is in the state of being mounted on the substrate 50. In the semiconductor device according to the third embodiment, the provision of the grounding electrodes 74 and 76 enables an output signal to be evaluated more accurately with respect to a radiofrequency characteristic (in the milliwave band in particular).

While the coupler circuit 70 is connected on the output side of the transistor 12, the coupler circuit may alternatively be connected to any other point for desired inspection. In the case of handling a milliwave-b and signal, it is desirable to provide two grounding pads on opposite sides of the pad electrode 72. In the case of handling a signal of a frequency lower than the milliwave band, it is not necessary to provide the grounding electrodes on opposite sides of the pad electrode 72; one of the two ground electrodes suffices.

Fourth Embodiment

Figure 11:
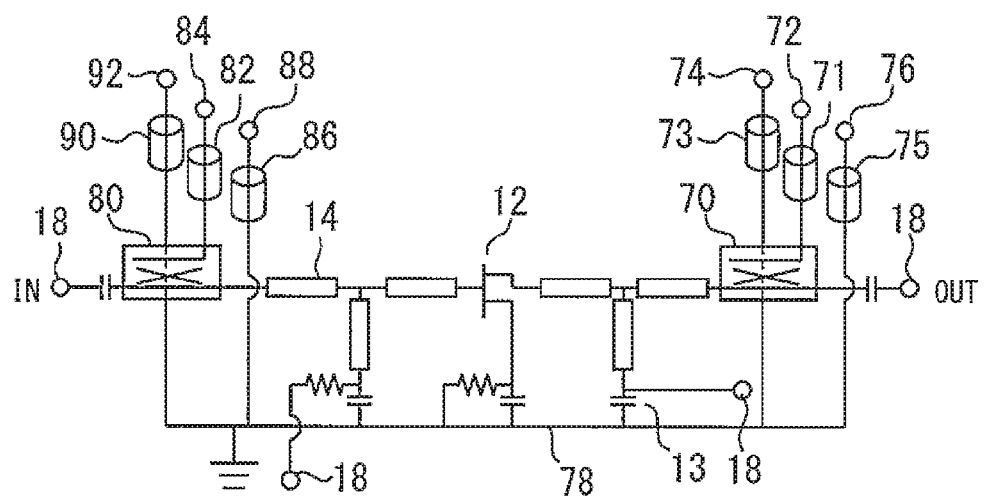
FIG. 11 is a circuit diagram of the semiconductor device according to the fourth embodiment.

FIG. 11 is a circuit diagram of the semiconductor device according to the fourth embodiment. This semiconductor device is formed by adding an arrangement capable of inspecting a input-side characteristic of the transistor to the semiconductor device according to the third embodiment. An input-side coupler circuit 80 is connected on the input side of the transistor 12, with the matching circuit interposed between the input-side coupler circuit 80 and the transistor 12. The input-side coupler circuit 80 is a circuit for divergence of the level of a radiofrequency-band signal input to the transistor 12. The input-side coupler circuit 80 is formed in the dielectric film 16 together with the transistor 12 and other elements. One output from the input-side coupler circuit 80 is input to the transistor 12. Another output from the input-side coupler circuit 80 is used for inspection. The semiconductor device has a grounding line 78, which is formed in the dielectric film 16.

Figure 12:
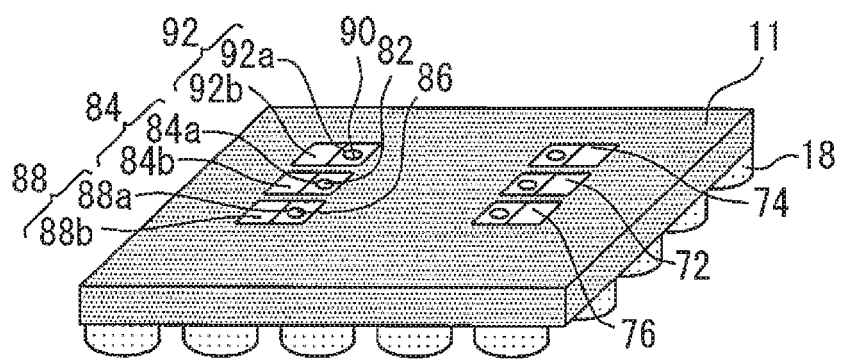
FIG. 12 is a perspective view of the semiconductor device according to the fourth embodiment.

A through hole 82 and additional through holes 86 and 90 are formed in the semiconductor substrate. An input detection pad electrode 84 and grounding electrodes 88 and 92 are also provided on the semiconductor device. FIG. 12 is a perspective view of the semiconductor device according to the fourth embodiment. The through hole 82 is formed in the semiconductor substrate 11. The input detection pad electrode 84 has a third portion 84a connected to an output of the input-side coupler circuit 80 in the through hole 82 and a fourth portion 84b connected to the third portion 84a and provided on the lower surface of the semiconductor substrate 11.

The additional through hole 86 is provided in the semiconductor substrate 11. The grounding electrode 88 has an in-hole portion 88a connected to the grounding line 78 in the additional through hole 86 and an out-of-hole portion 88b connected to the in-hole portion 88a and provided on the lower surface of the semiconductor substrate 11.

The additional through hole 90 is provided in the semiconductor substrate 11. The grounding electrode 92 has an in-hole portion 92a connected to the grounding line 78 in the additional through hole 90 and an out-of-hole portion 92b connected to the in-hole portion 92a and provided on the lower surface of the semiconductor substrate 11.

As can be understood from FIG. 12, the grounding electrodes 74 and 76 are provided on opposite sides of the pad electrode 72, and the grounding electrodes 88 and 92 are provided on opposite sides of the input detection pad electrode 84.

Figure 13:
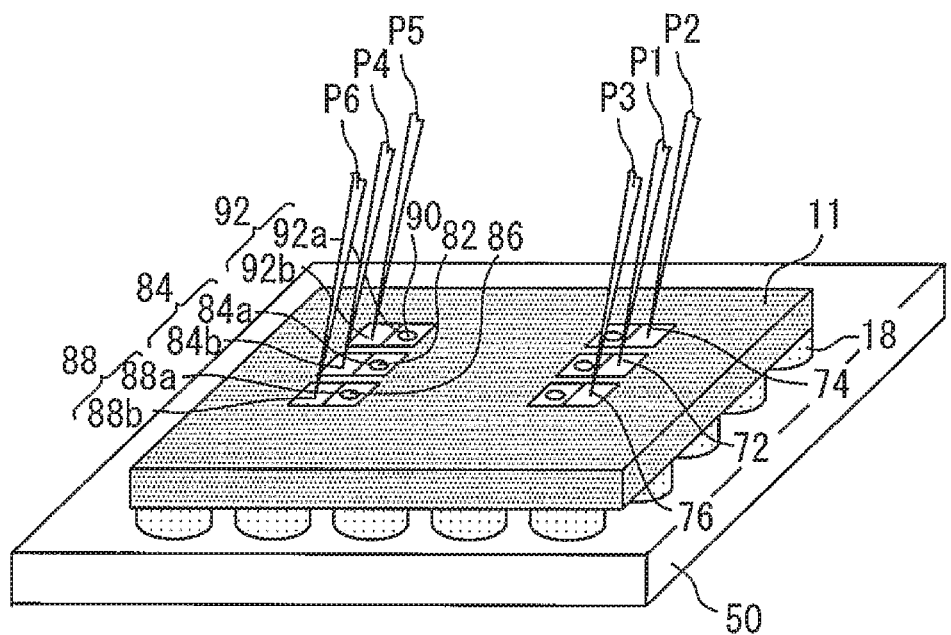
FIG. 13 is a diagram showing a method of inspecting the semiconductor device.

FIG. 13 is a diagram showing a method of inspecting the semiconductor device face-down-mounted. The pad electrode 72, the input detection pad electrode 84 and the grounding electrodes 74, 76, 88, and 92 provided on the back surface of the mounted semiconductor device are exposed to the outside. In this state, the inspection probe P1 is brought into contact with the pad electrode 72; inspection probes P2 and P3 are brought into contact with the grounding electrodes 74 and 76, respectively; an inspection probe P4 is brought into contact with the input detection pad electrode 84; and inspection probes P5 and P6 are brought into contact with the grounding electrodes 92 and 88, respectively. A characteristic of the semiconductor device is then inspected by applying an input signal to the transistor.

Thus, the coupler circuit provided on the input side of the transistor is added to the arrangement according to the third embodiment, thereby enabling an input characteristic of the semiconductor device with respect to a radiofrequency-band or milliwave-band input signal to be easily inspected. A suitable combination of the features of the semiconductor devices according to the embodiments described above may be made and used.

According to the present invention, an electrode for inspection is exposed on the lower surface of the semiconductor device face-down-mounted. Inspection of characteristics of the semiconductor device can therefore be performed easily when the semiconductor device is in the state of being mounted on the substrate.

Obviously many modifications and variations of the present invention are possible in the light of the above teachings. It is therefore to be understood that within the scope of the appended claims the invention may be practiced otherwise than as specifically described.

What is claimed is:

1. A semiconductor device comprising:
   a semiconductor substrate in which a through hole is formed;
   a transistor formed on the upper surface side of the semiconductor substrate;
   a coupler circuit formed on the upper surface side of the semiconductor substrate and connected to the transistor;
   a dielectric film covering the transistor and the coupler circuit;
   a solder bump formed on the dielectric film, the solder bump being exposed to outside; and
   a pad electrode having a first portion connected to an output of the coupler circuit in the through hole, and a second portion connected to the first portion and provided on a lower surface of the semiconductor substrate.

2. The semiconductor device according to claim 1, wherein the coupler circuit is connected on the output side of the transistor.

3. The semiconductor device according to claim 2, further comprising:
   an input-side coupler circuit formed in the dielectric film and connected on the input side of the transistor; and
   an input detection pad electrode having a third portion connected to an output of the input-side coupler circuit in a through hole provided in the semiconductor substrate other than the aforementioned through hole, and a fourth portion connected to the third portion and provided on the lower surface of the semiconductor substrate.

4. The semiconductor device according to claim 3, further comprising:
   a grounding line formed in the dielectric film; and
   a grounding electrode having an in-hole portion connected to the grounding line in an additional through hole provided in the semiconductor substrate, and an out-of-hole portion connected to the in-hole portion and provided on the lower surface of the semiconductor substrate,
   wherein the grounding electrode is provided in each of positions on opposite sides of the pad electrode and positions on opposite sides of the input detection pad electrode.

5. The semiconductor device according to claim 1, further comprising:
   a grounding line formed in the dielectric film; and
   a grounding electrode having an in-hole portion connected to the grounding line in an additional through hole provided in the semiconductor substrate, and an out-of-hole portion connected to the in-hole portion and provided on the lower surface of the semiconductor substrate.

\* \* \* \* \*